(12) United States Patent
Hurrell

(10) Patent No.: US 7,605,741 B2
(45) Date of Patent: Oct. 20, 2009

(54) DIGITALLY CORRECTED SAR CONVERTER INCLUDING A CORRECTION DAC

(75) Inventor: Christopher Peter Hurrell, Cookham (GB)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/634,053

(22) Filed: Dec. 5, 2006

(65) Prior Publication Data

US 2007/0132626 A1      Jun. 14, 2007

Related U.S. Application Data

(60) Provisional application No. 60/748,441, filed on Dec. 8, 2005.

(51) Int. Cl.
*H03M 1/34* (2006.01)
(52) U.S. Cl. ....................... 341/163; 341/118
(58) Field of Classification Search ................ 341/155, 341/144, 163, 172, 118, 120
See application file for complete search history.

(56) References Cited

U.S. PATENT DOCUMENTS

| | | | |
|---|---|---|---|
| 4,679,028 A * | 7/1987 | Wilson et al. ................ 341/120 |
| 5,684,487 A | 11/1997 | Timko | |
| 5,870,052 A * | 2/1999 | Dedic et al. ................. 341/161 |
| 6,351,231 B1 * | 2/2002 | Price et al. ................... 341/155 |
| 6,404,375 B1 * | 6/2002 | Munoz et al. ............... 341/172 |
| 6,717,542 B2 * | 4/2004 | Harada ........................ 341/161 |
| 6,850,181 B1 * | 2/2005 | Tsinker ....................... 341/163 |
| 6,882,295 B2 * | 4/2005 | Leung ........................ 341/155 |
| 7,173,557 B2 * | 2/2007 | Kuttner ....................... 341/163 |
| 7,286,075 B2 * | 10/2007 | Hennessy et al. ........... 341/172 |
| 7,501,965 B2 * | 3/2009 | Janakiraman ............... 341/118 |

FOREIGN PATENT DOCUMENTS

| EP | 0064147 | 11/1982 |
|---|---|---|
| WO | WO 96/39747 | 12/1996 |

OTHER PUBLICATIONS

PCT/US2006/047045 search report, Nov. 30, 2007.

* cited by examiner

*Primary Examiner*—Peguy JeanPierre
(74) *Attorney, Agent, or Firm*—Wolf, Greenfield & Sacks, P.C.

(57) ABSTRACT

An analog to digital converter having improved differential non-linearity is provided. The converter has a memory which is used to look up the actual weight or a weight error corresponding to the bits that have been kept as part of the SAR process to form an output correction value A part of this, for example a residue (the part following the decimal point in a decimal representation) is used to drive a correction DAC which causes a correction to be applied to the trial value presented to a comparator used by the ADC.

27 Claims, 2 Drawing Sheets

DIGITALLY CORRECTED SAR CONVERTER INCLUDING A CORRECTION DAC

FIELD OF THE INVENTION

The present invention relates to an improved successive approximation routine (SAR) analog to digital converter and method of improving accuracy of an analog to digital converter.

BACKGROUND OF THE INVENTION

Digitally calibrated successive approximation analog to digital converters (ADC), are now well known. To avoid missing codes in such ADCs, some form of error correction is required within a digital to analog converter, DAC, provided therein. This may take the form of radix less than 2 bit weights, additional error correction bits, or other forms of redundancy.

In an uncorrected traditional SAR converter, the final result is the sum of the ideal kept bit weights. For example, for a 6 bit converter which outputs the result 101011, the value of this result is taken as being 32+8+2+1=43. But suppose that for this converter we know that the actual bit weights are 32.5, 16.0, 8.4, 4.0, 2.1 and 1. A digitally corrected converter determines the final result by adding together the real weights of the kept bits 32.5+8.4+2.1+1=44 and then outputting the appropriate digital value representative of that result. The final result digitally corrected binary result is then 101100.

As mentioned above, a digitally corrected ADC does need some form of redundancy to avoid errors. To demonstrate this, consider the case where a 6 bit ADC has bit weights of 33, 16,8,4,2 and 1, i.e. the most significant bit is overweight by one least significant bit, LSB. Let's assume that the input is equivalent to a bit weight of say 32.9. The value of 33 would be rejected in the $1^{st}$ bit trial as the weight of 33 is larger than 32.9. All the subsequent bits would be kept giving a value of 16+8+4+2+1=31. This is in error by 1.9. To avoid this, redundancy is required of the same magnitude as the maximum total error of any combination of kept bits. For the above case we may want to add a redundant bit of weight 1 giving a DAC with weights 33,16,8,4,2,1,1. Now, after the MSB bit is rejected all the following bits are kept, including the additional redundant bit, giving a weight of 16+8+4+2+1+1=32. Now the error is reduced to 0.9 LSB, which is within the resolution of the converter.

A particularly important specification for an ADC is differential non-linearity known as DNL. This can be defined as the difference between the actual and the ideal code width of a converter code relative to the ideal code width (which is 1LSB). It is important to note that digital correction is a post processing activity. It is does not affect the operation of the analog part of the ADC at all. Hence transitions between codes occur at the same place for an analog ADC as for the same ADC with digital correction applied. This is a limitation of digitally corrected ADCs. Another important specification for an ADC is integral non-linearity known as INL. INL can be defined as the deviation from a straight line passing through the endpoints of the ADC transfer function. Digital correction will improve the INL of an ADC.

SUMMARY OF THE INVENTION

According to a first aspect of the present invention there is provided an analog to digital converter comprising a successive approximation engine; a conversion corrector; and a correction digital to analog converter in communication with the successive approximation engine; wherein during an analog to digital conversion the conversion corrector forms a conversion corrector output value and a portion of the conversion corrector output value is provided as a correction value to the correction digital to analog converter.

It is thus possible to provide a digitally corrected analog to digital converter where the steps between adjacent code transitions correspond to equally spaced changes to the input to the converter such that DNL errors are substantially removed.

Preferably the correction DAC has an output that from zero to full scale only spans only a few LSB.

Preferably the correction value is representative of a remainder (i.e. sub 1 LSB values or, if we convert for the purposes of discussion to a decimal representation, values to the right hand side of the decimal point) of a difference between an actual value of a bit being trialed and the ideal value of the bit being trailed. More preferably the correction value is representative of a remainder (or residue) of a difference between the actual value of the bits that have been kept within the conversion process, which may include the value of a bit being currently trialed, and the ideal value of those bits. Surprisingly the inventor has realized that the correction digital to analog converter can be limited to outputting a 1 LSB or slightly less than 1LSB remainder of the difference between the actual and ideal weights. The remainder may be slightly less than 1 LSB as binary bits forming the residue will sum to less than 1 LSB.

Advantageously the correction converter has a memory holding the actual weights of the bits. Consequently the correction converter can perform the dual role of providing a corrected digital output value and also forming a correction value that can then be used for the correction digital to analog converter. This correction value could be truncated to just the residue (i.e. the sub 1 LSB portion) or could be constrained to be representative of the difference between the actual and ideal values, with the integer part of the correction value, or indeed the entirety of the correction value, constrained to lie within a bounded range of values.

Thus the present invention provides a way of eliminating the DNL errors of a digitally corrected ADC. This is achieved by the addition of a very small DAC which in the preferred embodiment has a full scale span of just 1 LSB. This DAC accounts for the residue of the difference between the real and ideal bit weights and hence is known as the residue DAC in the description below. This invention can be considered as a hybrid between an analog and a digitally corrected ADC. The residue DAC plus any logic associated with it has an inverting operation. Hence the larger the residue fed to it the more negative will be the DAC output. Therefore the correction value or residue is, in the preferred embodiment, subtracted from the analog value output from the DAC being tested in the successive approximation conversion process.

According to a second aspect of the present invention there is provided a method of performing an analog to digital conversion comprising the steps of
  a. using a successive approximation converter to perform at least one bit trial as part of a successive approximation conversion;
  b. forming a conversion corrector output value taking account of discrepancies of actual bit weights in the successive approximation converter from their ideal values;
  c. using a value constrained representation of the conversion corrector output to form a correction which is applied to the successive approximation converter; and
  d. continuing with the successive approximation conversion.

According to a third aspect of the present invention there is provided a method of performing an analog to digital conversion comprising the steps of:
a. performing a plurality of bit trials as part of a successive approximation conversion;
b. determining the actual weight resulting from the bit trials, and calculating a residue;
c. using the residue to form a correction which is applied to the analog to digital converter; and
d. completing the successive approximation bit trials.

BRIEF DESCRIPTION OF THE DRAWINGS

The present invention will further be described, by way of non-limiting example only, with reference to the accompanying drawings, in which.

DESCRIPTION OF PREFERRED EMBODIMENTS OF THE INVENTION

Figure 1:
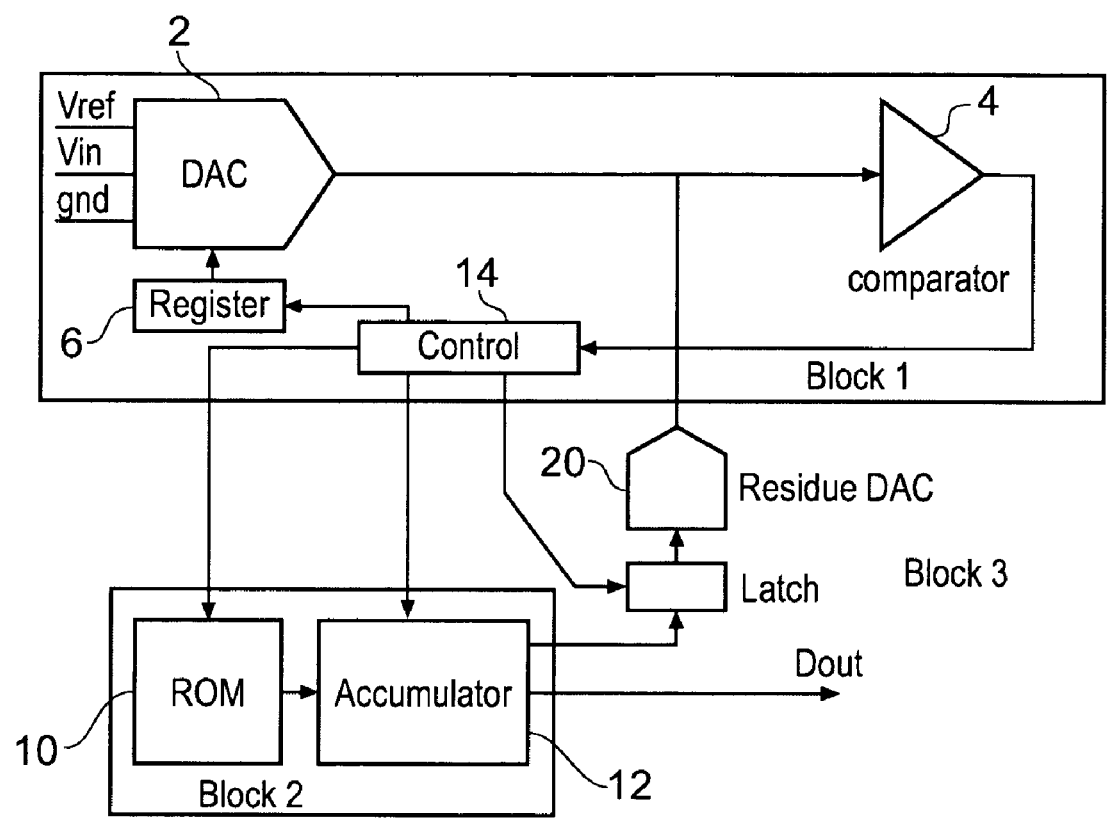
FIG. 1 schematically illustrates an ADC constituting an example of the present invention.

FIG. 1 shows a top level diagram of the ADC. Block 1 designates a successive conversion engine comprising a DAC 2, a comparator 4 and a successive approximation register 6, that form the major components of a SAR converter. Block 2 designates a conversion corrector which comprises a ROM 10 that contains representations of the actual (as opposed to ideal) bit weights and an accumulator 12 for adding these bit weights. Control logic 14 is shared by these blocks and is known to the person skilled in the art. A correction DAC 20 is provided to modify the voltage being compared by the comparator 4, and is responsive to an output of the accumulator 12. Block 1 and its DAC can be formed from any ADC/DAC technology and consequently needs no detailed description. It should be understood that DAC 2 is especially suited to being implemented in switched capacitor technology.

The operation of the components in block 2 should also be well understood by the person skilled in the art. The real weights of kept bits that have been kept as part of the SAR trial are called from the ROM and added together in the accumulator 12. The final result is then truncated to the required resolution, which is normally the resolution of the converter.

With the addition of the correction DAC 20 the operation of the ADC is as follows. As for a normal digitally corrected converter, after each bit trial, if a bit is to be kept, the real weight of that bit is pulled from the ROM and added in the accumulator to the sum of all the previous kept weights. However a portion of this accumulated sum, for example the "residue", that is the part of the result following the decimal point (or the remainder less that 1LSB) is calculated and made available to the correction DAC 20 for output into the analog part of the conversion engine.

Large errors in the bit weights are nearly always associated with the more significant bits. The less significant bits could therefore be considered as ideal. For example we may choose, in this simplified example, to consider the bit weights 4, 2, and 1 to be ideal. So after the bit trial associated with a bit weight of 8, the residue will not change. While the DAC is being set up to test the bit weight of 4, the residue is then fed to the correction DAC 20 so that from the bitweight 4 trial to the end, the comparator inputs also see the affect of the residue DAC. Bit weight 2 and 1 trials are then performed as normal.

To understand why the correction DAC 20 gets rid of DNL errors, consider a simple case, without a correction DAC, where just bit weight 8 is in error and has a value of 8.75 (made up of an integer portion of 8 and a residue portion of 0.75). Whenever this bit is set, the DAC will be ¾ LSB high. So changing from code 7 to 8 the DAC will change by an amount corresponding to 1.75 LSBs which will give rise to a DNL error of 0.75 LSB for the ADC. Now with the correction DAC 20 operating, this DAC subtracts the residue of ¾ LSB, giving a net weight for this bit of 8.75−0.75=8. The error of bit weight 8 has therefore been removed.

If this bit had a weight of 9.75 instead of 8.75 the residue DAC would still subtract an amount ¾ LSB giving a net weight of 9 when ever this bit is set. Although the ideal weight of this bit is 8, the accumulator will account for the integer part of the error as a value of 9.75 will have been added to the accumulator. The 0.75 part, i.e. the sub integer residue, of the error is effectively removed by the correction DAC.

Taking this further, consider the case where bit weight 16 is also in error and has an actual value of 16.5. The combined weight of these 2 bits is then 25.25. When these 2 bits are both kept, the correction DAC will subtract a value of 0.25 LSB giving a net weight of 25. In this case the residue part, that is the part less than 1 LSB of the DAC error has been removed, but the combined weight is still 1 LSB high as it should be 24 LSB. Again the integer part of the error is accounted for in the accumulator as a value of 25.25 will have been added to the accumulator and the final result is taken as being the integer part of the accumulator output.

A SAR converter can be regarded as operating like a weigh scale where we are searching for the combined weights that equals (or balances) the analog value we are trying to measure. If we have reached balance by the end of the conversion, then if we know the combined value of the real weights, we know the weight of the input value we are trying to measure. So in the case above, if setting these 2 bits causes balance then we know that the input value has a weight of 25 to within 1 LSB, the resolution of the converter.

As noted hereinbefore for a DAC with real errors, a digitally calibrated ADC needs redundancy to avoid errors. Changing the correction DAC a few LSBs before the end of the conversion adds a further requirement for redundancy. As described above, the residue DAC may decrement by an amount between 0 and 1 LSB. For the converter to still reach 'balance' by the end of conversion, the DAC 2 must be able to also increment by an amount between 0 and 1 LSB. This could be done in a number of ways. One way would be to have an additional redundant bit with a weight of 1 LSB that is tested after the final (or only) update of the correction DAC.

The above broad concepts can be achieved in a variety of ways. The accumulation of the integer parts of some or all of the bit weights may be performed after the conversion to minimize noise coupling from the accumulator to other sensitive analog components. The correction DAC may have a different range, say from −0.5 to +0.5 to minimize the step size taken late in the conversion. The correction DAC may be updated more than once during the conversion rather than just the once as in the preferred embodiment.

While the correction DAC has been described as having a range of 1 LSB in the preferred embodiment, it is more likely that an N bit residue DAC would have an actual range of $(2^N-1)/2^N$ LSBs. Although as N gets larger this will tend to 1 LSB but it would not be exactly 1 LSB.

It may also be more efficient to have an accumulator with a larger number of sub LSB bits than the number of sub LSB bits in the residue DAC.

Figure 2:
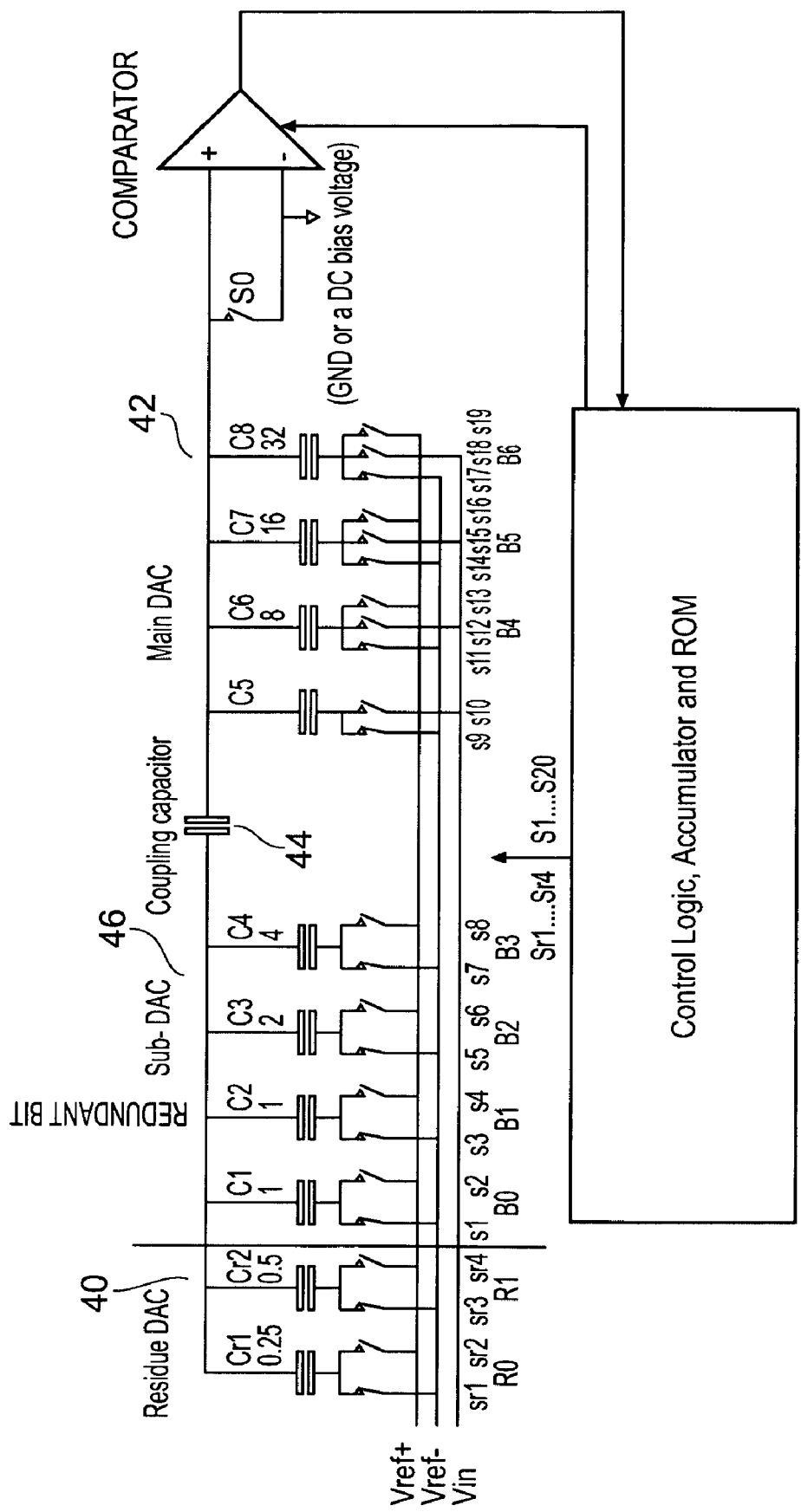
FIG. 2 schematically illustrates a preferred implementation of a switched capacitor SAR and residue DAC.

The correction DAC advantageously couples into the main DAC in such a way as to decrease the value at the output of the main DAC. However, in single ended ADC's the correction DAC could be coupled to an input of the comparator while the switched capacitor array used for the SAR trial is coupled to the other input of the comparator. In a further option, the comparator may be modified such that even if the ADC is a differential ADC the correction DAC can still modify the effective values of the signals presented by the switched capacitor arrays by summing the correction DAC's contribution at the comparator's input stage. In a switched capacitor DAC implementation, as shown in FIG. 2, the residue DAC 40 can be a separate DAC that couples in to a main DAC 42 via a coupling capacitor 44. High resolution converters will typically have a main DAC 42 and one or more sub DACs 46 with coupling capacitors 44 between them. In its most simple form a single sub DAC 46 couples in to the main DAC 42 with a small coupling capacitor. With such an arrangement the residue DAC 40 can be efficiently constructed by adding additional capacitors and associated switches to the sub DAC 46.

In the 6bit example (chosen to keep the example simple) of this preferred embodiment shown in FIG. 2, the DAC is split into two arrays (although it could be more) to reduce the overall size of the capacitor array with the signal only being sampled on to the main array. As is well known, a gain error will occur if the sub arrays do not also sample the input signal, unless a so-called sampling capacitor C5 is used. This capacitor, in the main array, samples the input in parallel with the other capacitors in the array but is then just switched to Vref− for the bit trials.

During sampling, switch S0 is closed, the residue capacitors Cr1 and Cr2 are switched to Vref+ by switches SR2 and SR4, capacitors C1 through C4 are switched to Vref− by switches S1, S3, S5 and S7 and capacitors C5 through C8 are switched to the input by switches S10, S12, S15 and S18. After sampling, S0 is opened, C1 through C7 are switched to Vref− and C8 is switched to Vref+ to allow testing of the MSB bit, B6. This capacitor is then switched back to Vref− if the comparator indicates that the DAC is positive with respect to the voltage on the inverting input to the comparator. The same bit trial operation is then performed on bits B5, B4, B3 and B2. The stored weight of kept bits is retrieved from the ROM 10 and added to the accumulator during the conversion. After bit trial B2, the residue from the accumulator is fed to residue DAC switches SR1 to SR4. If the 0.5 bit of the accumulator is a logical 1 then Cr2 driven plate is switched from Vref+ to Vref−. Likewise if the 0.25 bit of the residue DAC is a logical 1, Cr1 driven plate is switched from Vref+ to Vref−. In this way a negative shift in the sub DAC voltage may be generated that then couples in to the main DAC via the coupling capacitor. Bit trials B1 and B0 are then performed in the normal way. The final result is taken as being the integer part of the accumulator output.

Differential SAR converters are well known. These converters typically have DAC arrays that couple in to the two inputs of the comparator. In such a converter, the correction DAC can be formed as part of the negative array. The capacitors of such a residue DAC would then be switched in a more conventional way, with the driven node of selected capacitors being switched from Vref− to Vref+ to create a positive shift in the negative DAC. This has the same effect as creating a negative shift in the positive DAC as described above.

Although the present invention has been described in the context of only passing the residue-that is, the portion following the decimal point, to the correction DAC, other modes of operation are also possible. Thus, an error between the actual value of the weights in the successive approximation conversion engine and the ideal value of the weights in the successive approximation conversion engine can be calculated and a portion of this difference value can be used to drive the correction DAC. Thus, looking at this difference as comprising an integer part and a residue part, the integer part may be bounded to lie within a range, for example 1 or 2 LSB, whilst the residue part may be passed without modification such that the maximum correction applied by the correction DAC might be the sum of the bounded integer part and the residue part, and hence in itself may be limited to perhaps 2 or 3 LSB.

There are however substantial benefits in limiting the correction value supplied to the correction DAC to an amount just less than 1 LSB (the residue). A correction DAC which has a full scale range just less than 1LSB will not only be physically smaller than a correction DAC which has a full scale range of several LSB but will also have smaller gain and DNL errors. A particular advantage of using just the residue arises from the fact that any value fed to the correction DAC must also be subtracted from the conversion result given by the sum of the actual kept bit weights. Where only the residue is fed to the correction DAC, no actual subtraction operation is required since the residue is effectively subtracted by ignoring values less than 1 LSB in the conversion result. However if the correction DAC is fed by a range of values greater the 1 LSB, then an actual subtraction operation is required.

It is well known to sum the ideal values of the bit weights separately from the bit weight errors. It is then possible to provide the entire accumulated kept bit weight errors as an input to the correction DAC such that the DAC output has the kept bit weight errors removed. The final result is then given by the accumulated ideal bit weights. However, the correction DAC will then have to accommodate both the entire integer portion and the residue portion of the kept bit weight errors. As a result a much larger correction DAC is required.

Although the correction DAC is shown as being in communication with a DAC within the successive approximation conversion engine it is also possible to connect the correction DAC directly to the comparator, such that, for example, the main DAC is connected to the non-inverting input of the comparator and the correction DAC is connected to the inverting input of the comparator.

As noted hereinbefore the successive approximation conversion engine requires redundancy. This can be provided in manners known to the person skilled in the art, for example by the inclusion of redundant bits or by using a conversion engine of radix less than 2.

The above method is also an efficient method for removing DNL error since no more than one additional bit trial is required. This compares favorably with the prior art method of making an ADC with higher resolution than required and then rounding or truncating to the required resolution. Whilst this does not remove DNL errors they may then be reduced to an acceptable level.

The invention claimed is:
1. An analog to digital converter comprising:
 a successive approximation engine which develops and keeps weights of bits determined during successive bit trials of a successive approximation conversion;
 a conversion corrector arranged to perform digital and analog correction of the analog to digital converter; and
 a correction digital to analog converter in communication with the successive approximation engine;
 wherein during a bit trial of an analog to digital conversion the conversion corrector forms a digital conversion corrector output value representing actual weights of the bits kept during the successive approximation conversion and a value-constrained representation of the conversion corrector output value is provided as a correction value to the correction digital to analog converter, so as to modify an analog signal presented to a comparator within the successive approximation engine for a subsequent bit trial so as to improve differential non-linearity of the converter.

2. An analog to digital converter as claimed in claim 1, in which the conversion corrector comprises a memory storing the actual values of the bit weights of the successive approximation engine, and the actual values of the bit weights selected by the successive approximation engine are summed to form the conversion corrector output value.

3. An analog to digital converter as claimed in claim 1, in which the conversion corrector comprises a memory storing a difference between the actual values of the bit weights and the ideal bit weights of the successive approximation engine and the differences for the bit weights selected by the successive approximation engine are summed to form the conversion corrector output value.

4. An analog to digital converter as claimed in claim 1, in which the correction value is applied at least one bit trial prior to the end of the successive approximation conversion.

5. An analog to digital converter as claimed in claim 1, in which the correction value is applied to the successive approximation engine so as to increase a difference between an output of a DAC of the successive approximation engine and a reference input at a comparator of the successive approximation engine.

6. An analog to digital converter as claimed in claim 1, in which the values of the bit weights selected are read from memory to find a true bit weight, and a residue of the true bit weight is used as an input for the correction digital to analog converter.

7. An analog to digital converter as claimed in claim 1, in which the portion of the conversion output value comprises a residue thereof.

8. An analog to digital converter as claimed in claim 1, in which the analog to digital converter comprises a first switched capacitor array for presenting trial values during the successive approximation conversion process, and the correction digital to analog converter is formed as a plurality of switched capacitors in a further array in communication with the first switched capacitor array.

9. An analog to digital converter as claimed in claim 1, in which the portion of the conversion corrector output value is the residue of the conversion corrector output value.

10. An analog to digital converter as claimed in claim 1, wherein the correction value has a range of one least significant bit.

11. An analog to digital converter as claimed in claim 1, where the correction value has a range of less than one least significant bit of the analog to digital converter output.

12. An analog to digital converter as claimed in claim 1, in which the analog to digital conversion engine has redundancy.

13. An analog to digital converter as claimed in claim 12, in which some of the redundancy of the successive approximation conversion engine occurs in one or more bit trials following a final update to the correction digital to analog converter.

14. An analog to digital converter as claimed in claim 1, in which the correction digital to analog converter is formed as part of a digital to analog converter within the successive approximation engine or is in communication with a comparator input of a comparator within the successive approximation engine.

15. An analog to digital converter as claimed in claim 1, in which the correction value is applied to the successive approximation engine in such a manner that for at least some inputs to the analog to digital converter, an otherwise unkept subsequent bit weight will then be kept.

16. A method of performing an analog to digital conversion comprising the steps of:
  a. using a successive approximation converter to perform at least one bit trial as part of a successive approximation conversion;
  b. forming a digital conversion corrector output value taking account of discrepancies of actual bit weights in the successive approximation converter from an ideal value thereof;
  c. using a value constrained representation of the conversion corrector output to form an analog correction which is applied to the successive approximation converter so as to reduce differential non-linearity errors within the successive approximation converter; and
  d. continuing with the successive approximation conversion.

17. A method as claimed in claim 16, in which the constrained representation of the conversion output is a residue part thereof.

18. A method of performing an analog to digital conversion comprising the steps of:
  a. performing a plurality of bit trials as part of a successive approximation conversion;
  b. digitally determining the actual weight resulting from the bit trials, and calculating a residue;
  c. using the residue to form an analog correction which is applied to the analog to digital converter so as to modify a bit trial value within the analog to digital converter; and
  d. completing the successive approximation conversion.

19. A method as claimed in claim 18, in which the residue correction has a magnitude of less than one least significant bit.

20. A method as claimed in claim 18, in which the correction is subtracted from the trial value produced by the ADC as part of the successive approximation process.

21. A method as claimed in claim 18, further comprising the step of outputting the result of the successive approximation bit trial excluding the residue.

22. An analog to digital converter comprising:
  a successive approximation engine having a comparator therein;
  a conversion corrector; and
  a correction digital to analog converter in communication with the successive approximation engine;
  wherein during an analog to digital conversion the conversion corrector forms a digital conversion corrector output value and a portion of the conversion corrector output value is provided as an analog correction value to the correction digital to analog converter, and an output of the correction digital to analog converter is provided to an input of the comparator.

23. An analog to digital converter comprising:
  a successive approximation engine having a digital to analog converter therein having an output provided to a comparator;
  a conversion corrector; and
  a correction digital to analog converter in communication with the successive approximation engine;
  wherein during an analog to digital conversion the conversion corrector forms a digital conversion corrector output value and a portion of the conversion corrector output value is provided as an analog correction value to the correction digital to analog converter, and an output of the correction digital to analog converter is connected to the output of the digital to analog converter of the successive approximation engine so as to modify the signal presented to the comparator, and thereby reduce dynamic non-linearity of the analog to digital converter.

24. An analog to digital converter comprising a successive approximation engine, and further including conversion corrector comprising a memory holding representations of actual bit weights such that errors in bit weights can be corrected in a digital fashion, and further including a correction digital to analog converter for applying an analog bit weight correction based on a bit weight error as determined by the conversion corrector.

25. An analog to digital converter comprising:
a successive approximation engine;
a conversion corrector; and
a correction digital to analog converter in communication with the successive approximation engine;
wherein during an analog to digital conversion the conversion corrector forms a digital conversion corrector output value and a residue portion of the conversion corrector output value is provided as a correction value to the correction digital to analog converter, the residue portion further comprising an integer part of the conversion corrector output value, said integer part being constrained to lie within a predetermined range of values.

26. An analog to digital converter comprising:
a successive approximation engine;
a conversion corrector;
a first switched capacitor array for presenting trial values during the successive approximation conversion process; and
a correction digital to analog converter in communication with the successive approximation engine, the correction digital to analog converter being formed as a plurality of switched capacitors in a further array in communication with the first switched capacitor array;
wherein during an analog to digital conversion the conversion corrector forms a conversion corrector output value and portion of the conversion corrector output value is provided as a correction value to the correction digital to analog converter.

27. An analog to digital converter as claimed in claim 26, in which the capacitors in the further array are not involved with sampling the input signal and are separated from the capacitors of the first array used to sample the input signal via at least one coupling capacitor.

* * * * *